(12) United States Patent
Peethala et al.

(10) Patent No.: US 10,699,945 B2
(45) Date of Patent: Jun. 30, 2020

(54) BACK END OF LINE INTEGRATION FOR INTERCONNECTS

(71) Applicant: INTERNATIONAL BUSINESS MACHINES CORPORATION, Armonk, NY (US)

(72) Inventors: Cornelius B. Peethala, Slingerlands, NY (US); Raghuveer R. Patlolla, Guilderland, NY (US); Chih-Chao Yang, Glenmont, NY (US); Roger A. Quon, Rhinebeck, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/151,390

(22) Filed: Oct. 4, 2018

(65) Prior Publication Data

US 2020/0111699 A1    Apr. 9, 2020

(51) Int. Cl.
*H01L 21/768* (2006.01)
*H01L 21/3213* (2006.01)
*H01L 23/528* (2006.01)
*H01L 23/532* (2006.01)
*H01L 21/311* (2006.01)
*H01L 21/321* (2006.01)

(52) U.S. Cl.
CPC .... *H01L 21/7684* (2013.01); *H01L 21/31144* (2013.01); *H01L 21/32134* (2013.01); *H01L 21/7685* (2013.01); *H01L 21/76802* (2013.01); *H01L 21/76877* (2013.01); *H01L 23/528* (2013.01); *H01L 23/53238* (2013.01); *H01L 23/53257* (2013.01); *H01L 21/3212* (2013.01)

(58) Field of Classification Search
CPC ........... H01L 21/7684; H01L 21/76877; H01L 21/7685; H01L 21/32134; H01L 21/76802; H01L 21/3212; H01L 23/528; H01L 23/3238; H01L 23/3257; H01L 21/31144; H01L 21/786; H01L 21/3113; H01L 21/311; H01L 21/321; H01L 23/53238; H01L 23/53257; H01L 23/532
USPC ........................................................ 257/751
See application file for complete search history.

(56) References Cited

U.S. PATENT DOCUMENTS

| | | | |
|---|---|---|---|
| 8,158,532 B2 | 4/2012 | Mayer et al. | |
| 8,828,870 B2 | 9/2014 | Cabral, Jr. et al. | |
| 8,871,635 B2 | 10/2014 | Park et al. | |
| 9,153,558 B2 | 10/2015 | Filippi et al. | |
| 9,190,323 B2 | 11/2015 | Zhang et al. | |
| 9,269,612 B2 | 2/2016 | Chen et al. | |
| 9,287,345 B2 * | 3/2016 | Chen | H01C 7/006 |
| 9,754,883 B1 | 9/2017 | Briggs et al. | |
| 9,786,553 B1 * | 10/2017 | Yang | H01L 23/5222 |
| 9,806,023 B1 | 10/2017 | Briggs et al. | |

(Continued)

*Primary Examiner* — Alexander O Williams
(74) *Attorney, Agent, or Firm* — Tutunjian & Bitetto, P.C.; Vazken Alexanian

(57) ABSTRACT

A method for back end of line (BEOL) integration for one or more interconnects includes forming one or more interconnects by depositing conductive material on a diffusion barrier layer in respective ones of one or more trenches formed within an interlevel dielectric, forming one or more cap layers on respective ones of the one or more interconnects, and selectively etching the diffusion barrier relative to the one or more cap layers to remove portions of the diffusion barrier layer along the interlevel dielectric.

16 Claims, 7 Drawing Sheets

(56) References Cited

U.S. PATENT DOCUMENTS

| | | | |
|---|---|---|---|
| 9,859,218 B1* | 1/2018 | Patlolla | H01L 23/53238 |
| 2006/0024899 A1* | 2/2006 | Crenshaw | H01L 23/5223 |
| | | | 438/381 |
| 2008/0088026 A1* | 4/2008 | Yang | H01L 21/76834 |
| | | | 257/762 |
| 2010/0155893 A1* | 6/2010 | Chen | H01C 7/006 |
| | | | 257/537 |
| 2013/0187273 A1 | 7/2013 | Zhang et al. | |
| 2014/0264908 A1* | 9/2014 | Lee | H01L 23/49827 |
| | | | 257/774 |
| 2014/0332965 A1 | 11/2014 | Bao et al. | |
| 2015/0076695 A1* | 3/2015 | Cheng | H01L 23/53238 |
| | | | 257/751 |
| 2016/0118335 A1* | 4/2016 | Lee | H01L 23/53295 |
| | | | 257/774 |
| 2018/0061761 A1 | 3/2018 | Briggs et al. | |

* cited by examiner

BACK END OF LINE INTEGRATION FOR INTERCONNECTS

BACKGROUND

Technical Field

The present invention generally relates to semiconductor devices, and more particularly to back end of line (BEOL) integration for interconnects.

Description of the Related Art

Integrated circuit processing can be divided into phases including front end of line (FEOL) processing and back end of line (BEOL) processing. FEOL processing refers to the fabrication of individual integrated circuit devices (e.g., transistors, capacitors, resistors). BEOL processing refers to the portion of semiconductor device (e.g., integrated circuit) fabrication where the individual devices are interconnected with conductive wiring (e.g., metal wiring) on the wafer. Generally, BEOL processing includes forming at least one layer of a conductive material (e.g., metallization layer) on the wafer, and etching to remove portions of the at least one layer of conductive material to form the conductive wiring. Multiple layers of conductive material may be needed to complete the integrated circuit, which can be interconnected by creating vias through dielectric layers that function to isolate the conductive wiring to prevent short circuiting. After BEOL processing, post-fabrication processes can be performed, which can include wafer testing, die separation and testing, packaging, etc.

SUMMARY

In accordance an embodiment of the present invention, a method for back end of line (BEOL) integration for one or more interconnects is provided. The method includes forming one or more interconnects by depositing conductive material on a diffusion barrier layer in respective ones of one or more trenches formed within an interlevel dielectric, forming one or more cap layers on respective ones of the one or more interconnects, and selectively etching the diffusion barrier relative to the one or more cap layers to remove portions of the diffusion barrier layer along the interlevel dielectric.

In accordance another embodiment of the present invention, a method for back end of line (BEOL) integration for one or more interconnects is provided. The method includes forming an interlevel dielectric including a low-k dielectric material, forming one or more trenches within the interlevel dielectric, forming one or more interconnects by depositing conductive material on a diffusion barrier layer in respective ones of the one or more trenches, forming one or more cap layers on respective ones of the one or more interconnects, and selectively etching the diffusion barrier relative to the one or more cap layers to remove portions of the diffusion barrier layer along the interlevel dielectric.

In accordance with yet another embodiment of the present invention, a semiconductor device is provided. The device includes an interlevel dielectric including an ultra low-k dielectric material, one or more trenches within the interlevel dielectric, a diffusion barrier layer disposed along walls of the one or more trenches, one or more interconnects including conductive material disposed within the one or more trenches, and one or more cap layers disposed on respective ones of the one or more interconnects. The one or more cap layers include a material that has properties permitting selective deposition on the one or more interconnects.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
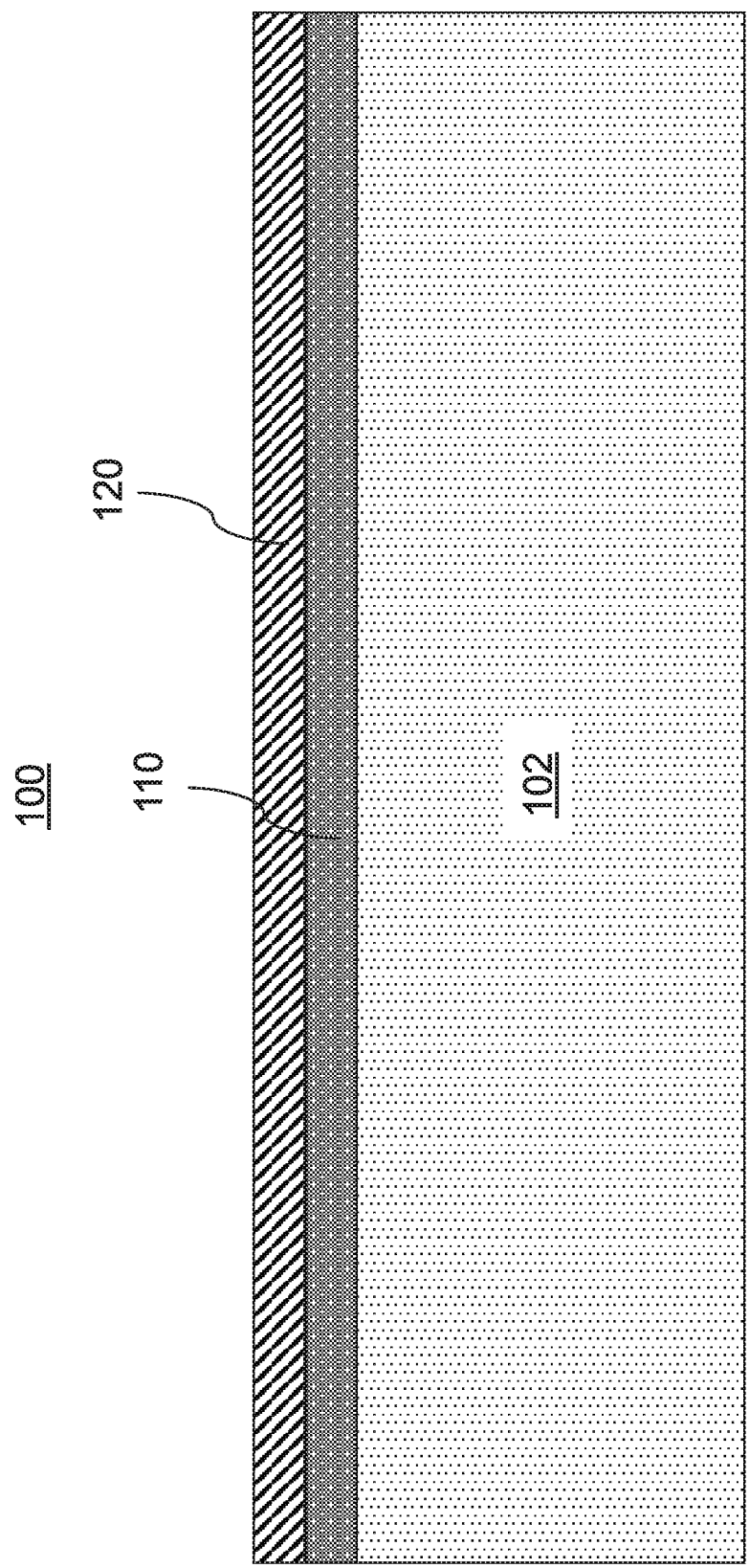
FIG. 1 is a cross-sectional view showing an interlevel dielectric (ILD), optional sacrificial dielectric layer and hard mask layer formed during the fabrication of a semiconductor device, in accordance with an embodiment of the present invention.

Current challenges with interconnect metallization during back end of line (BEOL) integration include having to start with a higher trench height than a target trench height to accommodate trench height reduction (e.g., about 20 nm) during barrier planarization (e.g., barrier chemical-mechanical planarization (CMP)). Having to start with a higher trench height than a target post-planarization trench height can result in smaller grains, metallization voids, and poor barrier/liner/seed conformality. In addition, barrier planarization processes can result in feature loss.

To address these and other challenges, aspects of the present embodiments provide for the formation of trenches having a height substantially equal to the target post-planarization trench height. The embodiments describe herein replace barrier planarization (e.g., barrier CMP) with selective cap layer deposition and wet etch removal to minimize feature loss during BEOL integration for interconnects. The embodiments described herein can provide larger grains, and improved barrier/liner/seed conformality.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a cross-sectional view of a semiconductor device 100 is provided. As shown in FIG. 1, the device 100 includes an interlevel dielectric (ILD) 102. The ILD 102 can have a dielectric constant (k) from, e.g., about 1 to about 5. In one embodiment, the ILD 102 can include a low-k dielectric material. A low-k dielectric material is a dielectric material that includes a dielectric constant less than about 3.9, which corresponds to the dielectric constant of silicon dioxide ($SiO_2$). In one embodiment, the ILD 102 can include an ultra low-k (ULK) dielectric material. For example, the ILD 102 can include a dielectric material having a dielectric constant below, e.g., about 3.4. The ILD 102 can be formed with a low-k dielectric material or an ULK dielectric material to reduce parasitic phenomena such as, e.g., resistance-capacitance delay, crosstalk and power dissipation.

The ILD 102 can include any suitable dielectric material in accordance with the embodiments described herein. Examples of suitable dielectric materials include, but are not limited to, a carbon doped oxide dielectric material (e.g., SiCOH), a fluorinated silicon oxide material (e.g., SiOF), a spin-on methyl-silisesquioxane (MSQ), an organic polymer, etc.

As shown in FIG. 1, an optional sacrificial dielectric layer 110 can be formed on the ILD 102 using any suitable process in accordance with the embodiments described herein. The sacrificial dielectric layer 110 can include any suitable dielectric material in accordance with the embodiments described herein. For example, the sacrificial dielectric layer 110 can include, e.g., $SiO_2$ or a silicon nitride material (e.g., SiN or $Si_3N_4$).

As further shown in FIG. 1, a hard mask 120 is formed on the sacrificial dielectric layer 110 using any suitable process in accordance with the embodiments described herein. The hard mask 120 functions to maintain proper via and/or interconnect alignment during BEOL processing. The hard mask 110 can include any material that has a suitable hardness for maintaining proper via and/or interconnect alignment during BEOL processing, in accordance with the embodiments described herein. In one embodiment, the hard mask 120 can be a metal hard mask. For example, the hard mask 120 can include, e.g., titanium nitride (TiN). The hard mask 120 can enable patterning of interconnects at, e.g., 10 nm and beyond.

Although not shown, the device 100 can be formed on a wafer including a substrate. The substrate can include any suitable substrate structure, e.g., a bulk semiconductor, a semiconductor-on-insulator (SOI) substrate, etc. In one example, the substrate can include a silicon-containing material. Illustrative examples of Si-containing materials suitable for the substrate can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide, gallium nitride, silicon germanium, cadmium telluride, zinc selenide, etc.

Figure 2:
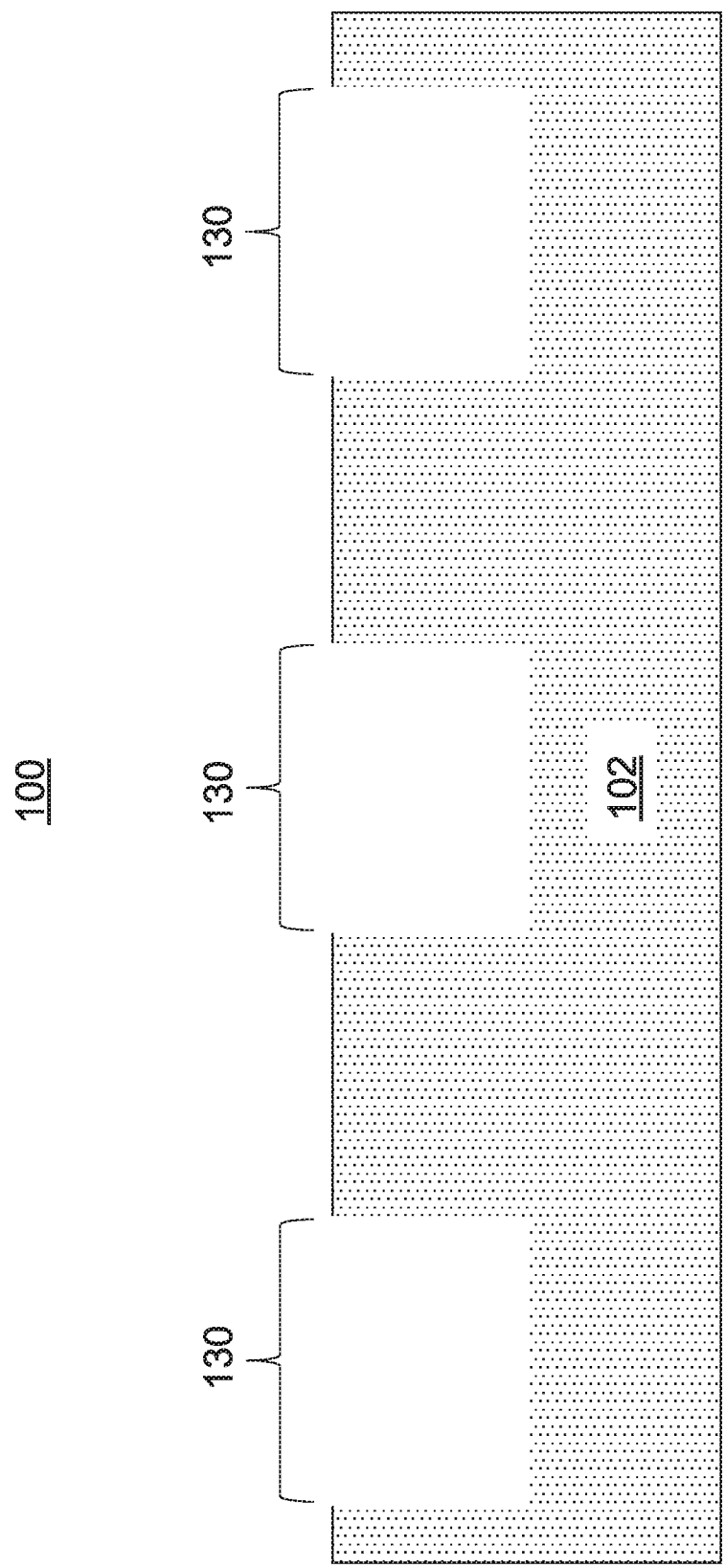
FIG. 2 is a cross-sectional view showing the formation of trenches during the fabrication of the semiconductor device, in accordance with an embodiment of the present invention.

With reference to FIG. 2, a plurality of trenches 130 are formed within the ILD 102, and the sacrificial dielectric layer 110 and hard mask 120 are removed. The plurality of trenches 130 can each have a height about, e.g., 20 nm lower than conventional trenches. Any suitable processes can be used to form the plurality of trenches 130. For example, patterning can be performed through lithography and etching. Although three trenches 130 are shown in this illustrative example, any number of trenches can be formed in accordance with the embodiments described herein.

Figure 3:
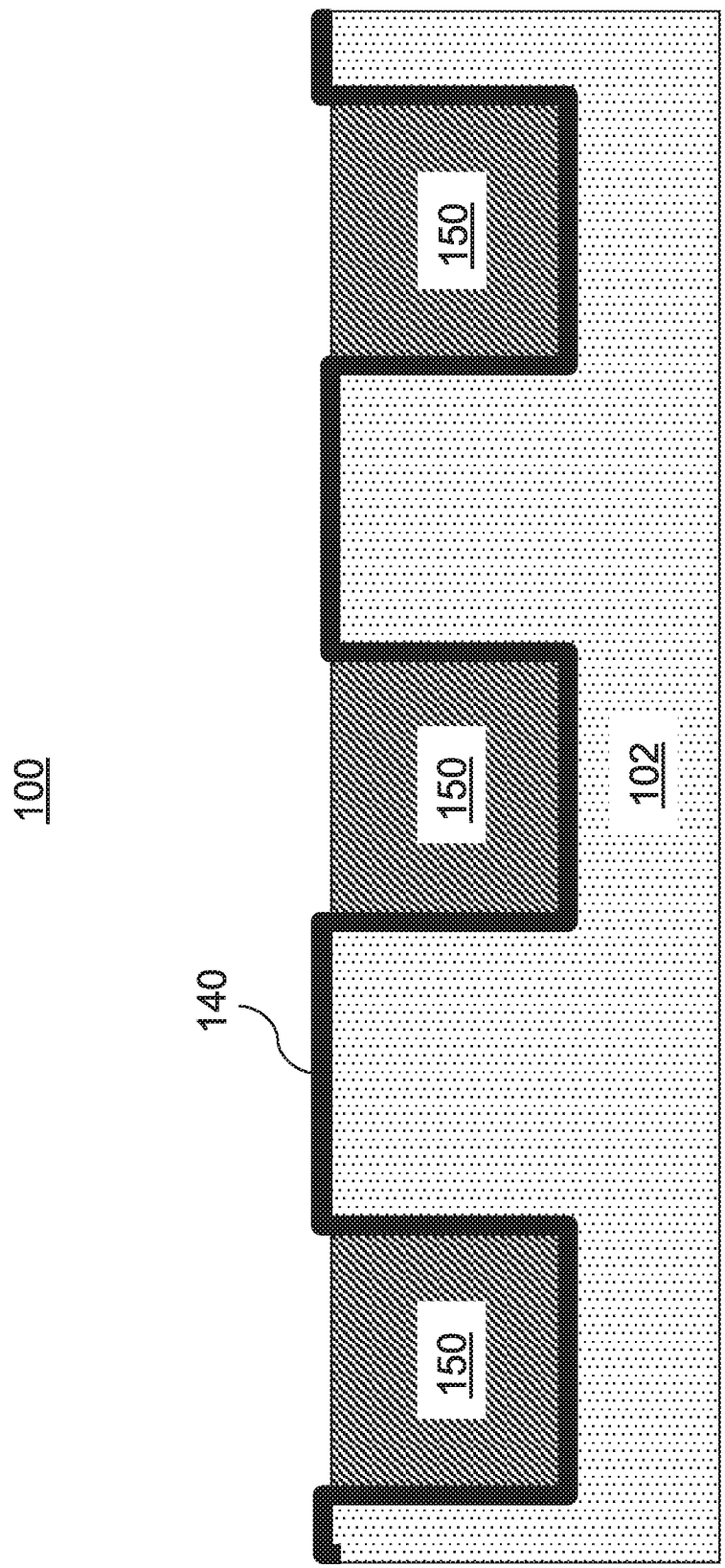
FIG. 3 is a cross-sectional view showing the formation of a diffusion barrier layer and interconnects during post-metallization and planarization performed during the fabrication of the semiconductor device, in accordance with an embodiment of the present invention.

With reference to FIG. 3, a diffusion barrier layer 140 is formed on the ILD 102, and conductive material is deposited on the diffusion barrier layer 140 in the trenches 130 to form interconnects 150. In one embodiment, as shown, the diffusion barrier layer 140 can be conformally deposited along the exposed surfaces of the ILD 102.

Forming the interconnects 150 can further include planarizing the conductive material (e.g., using CMP). The interconnects 150 can include any suitable conductive material in accordance with the embodiments described herein. Examples of suitable conductive materials for the interconnects 150 can include, but are not limited to, copper (Cu), cobalt (Co), ruthenium (Ru), aluminum (Al), etc.

The aspect ratio (AR) of an interconnect can be defined as a ratio of the thickness of the interconnect to the width of the interconnect. In one embodiment, the AR of the interconnects 150 is less than, e.g., about 2. More specifically, the AR of the interconnects can be less than, e.g., about 1. Thus, the interconnects 150 can have a relative low AR, which can provide benefits for both electrical conductivity and electromigration reliability.

Electromigration refers to the transport of material caused by the movement of ions in a conductor resulting from the transfer of momentum between conducting electrons and diffusing (metal) atoms. In the context of integrated circuits, electromigration can decrease reliability. For example, electromigration can lead to connection loss or failure of an integrated circuit within, e.g., an interconnect. There is an inverse relationship between the size of the integrated circuit and the impact that electromigration can have on the integrated circuit. That is, the smaller the size of the electronics device, the greater the impact that electromigration can have on the integrated circuit.

The diffusion barrier layer 140 functions as a barrier to provide isolation from interconnects 150 to prevent diffusion of the conductive material of the interconnects 150, while maintaining electrical conductivity. That is, the diffusion barrier layer 140 should include material(s) that provide a suitably low diffusivity with respect to the conductive material (e.g., copper (Cu)), and a suitably high electrical conductivity.

The diffusion barrier layer 140 can include any suitable material in accordance with the embodiments described herein. Examples of suitable materials for the diffusion barrier 140 can include metals such as, e.g., a tantalum (Ta), titanium (Ti), ruthenium (Ru), tungsten (W), nickel (Ni), hafnium (Hf), niobium (Nb), zirconium (Zr), cobalt (Co) and/or vanadium (V), and/or conductive ceramic materials such as, e.g., a tantalum nitride (e.g., TaN), a titanium nitride (e.g., TiN), a tungsten nitride (e.g., WN) and/or an indium oxide (e.g., $In_2O_3$).

Figure 4:
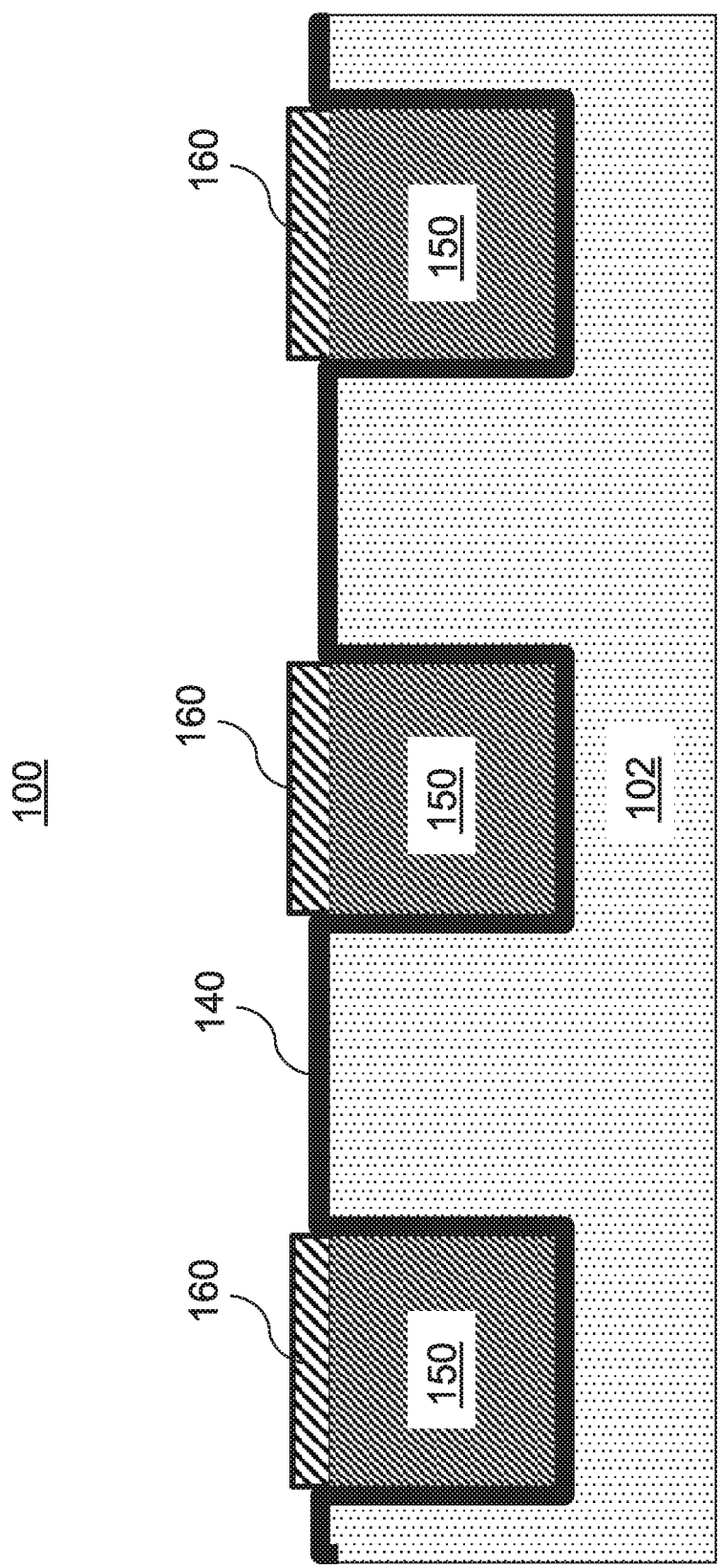
FIG. 4 is a cross-sectional view showing selective cap layer formation during the fabrication of the semiconductor device, in accordance with an embodiment of the present invention.

With reference to FIG. 4, cap layers 160 are formed on the interconnects 150. The cap layers 160 can include any suitable material in accordance with the embodiments described herein. For example, the cap layers 160 can include, e.g., cobalt (Co). In accordance with the embodiments described herein, the cap layers 160 can function to increase reliability at least with respect to electromigration effects by protecting the surfaces of the interconnects 150.

In one embodiment, the cap layers 160 can be formed by selectively depositing the cap layers 160 on the interconnects 150. For example, in an embodiment in which the cap layers 160 include Co, the diffusion barrier layer 140 includes, e.g., Ta(N) and the interconnects 150 include, e.g., Cu, the selectivity of Co deposition between Ta(N) and Cu can allow for the deposition on the Cu of the interconnects 150, and not the Ta(N) of the diffusion barrier layer 140. As used herein, the term "Ta(N)" refers to Ta and/or TaN.

Figure 5:
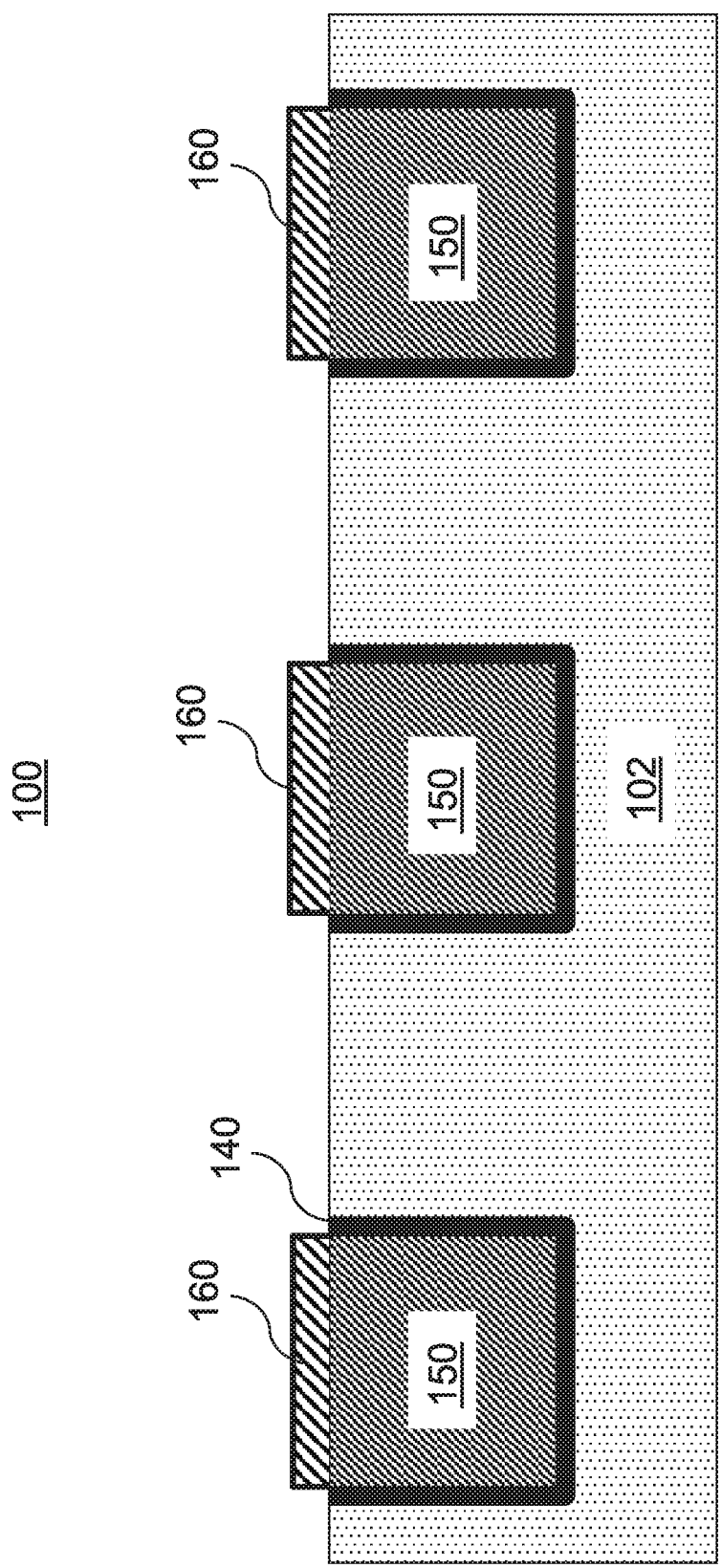
FIG. 5 is a cross-sectional view showing the removal of a portion of the diffusion barrier layer during the fabrication of the semiconductor device, in accordance with an embodiment of the present invention.

With reference to FIG. 5, portions of the diffusion barrier layer 140 along the top surface of the ILD 102 are removed. The portions of the diffusion barrier 140 can be removed by performing an etch process selective to the cap layers 160. That is, the cap layers 160 function to protect their corresponding interconnects 150 during the removal of the portions of the diffusion barrier layer 140.

In one embodiment, the etch process includes a wet etch process. Wet etch processes use liquid etchants to remove materials. For example, one or more masks can be used to define patterns for material removal, such that materials that are not protected by the one or more masks are removed by the etchant(s). Wet etch processes can generally be viewed as including the following three steps: introduction of the etchant(s) (e.g., etchant diffusion); reaction between the etchant(s) and the corresponding material (e.g., a reduction-oxidation (redox) reaction); and removal of the byproducts of the reaction (e.g., byproduct diffusion). Wet etch processes are generally isotropic etch processes in which the etch process goes in all directions at substantially the same rate, in contrast to anisotropic etch processes that operate in fewer than all directions (e.g., one direction). However, wet etch processes can be anisotropic.

Time-dependent dielectric breakdown (TDDB) refers to the breakdown of dielectric material caused by the formation of a conducting path through the dielectric material due to electron tunneling. TDDB can include extrinsic breakdown and/or intrinsic breakdown. Extrinsic breakdown results from defects introduced during device fabrication, whereas intrinsic breakdown results from defects formed by electrical stress. Low-k dielectrics generally have weaker intrinsic breakdown strength as compared to, e.g., $SiO_2$. Thus, degradation in the ILD 102, which as described above can include low-k or ULK dielectric material(s), can cause BEOL reliability problems at least with respect to TDDB.

Figure 6:
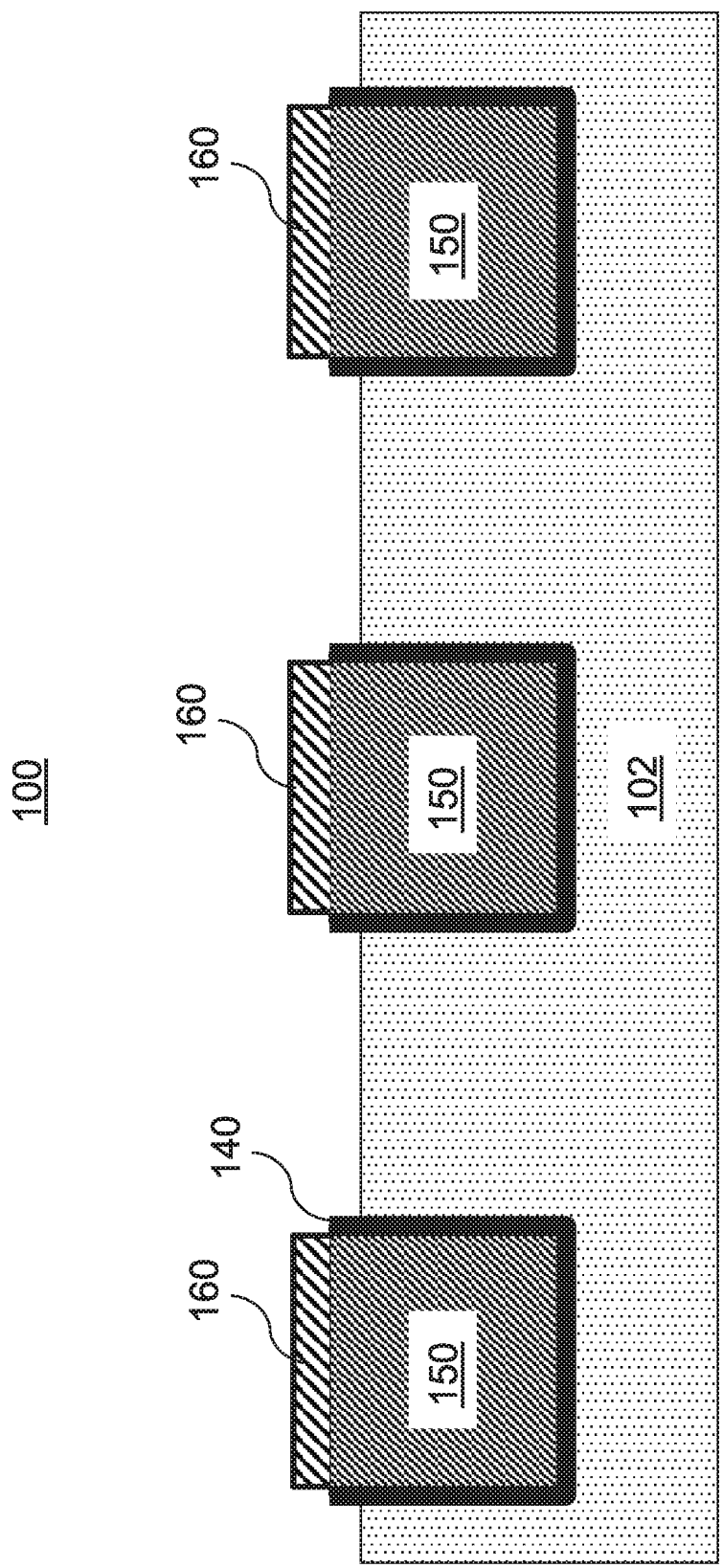
FIG. 6 is a cross-sectional view showing the removal of a portion of the ILD during the fabrication of the semiconductor device, in accordance with an embodiment of the present invention.

In consideration of the reliability concerns of TDDB, with reference to FIG. 6, damaged portions of the ILD 102 can (optionally) be removed by recessing the ILD 102. Removing the damaged portions of the ILD 102 can function to further increase reliability at least with respect to TDDB.

Further downstream processing (not shown) can be performed on the device 100. For example, additional BEOL processing and post-fabrication processing (e.g., wafer testing, wafer dicing, wafer testing and packaging) can be performed.

Figure 7:
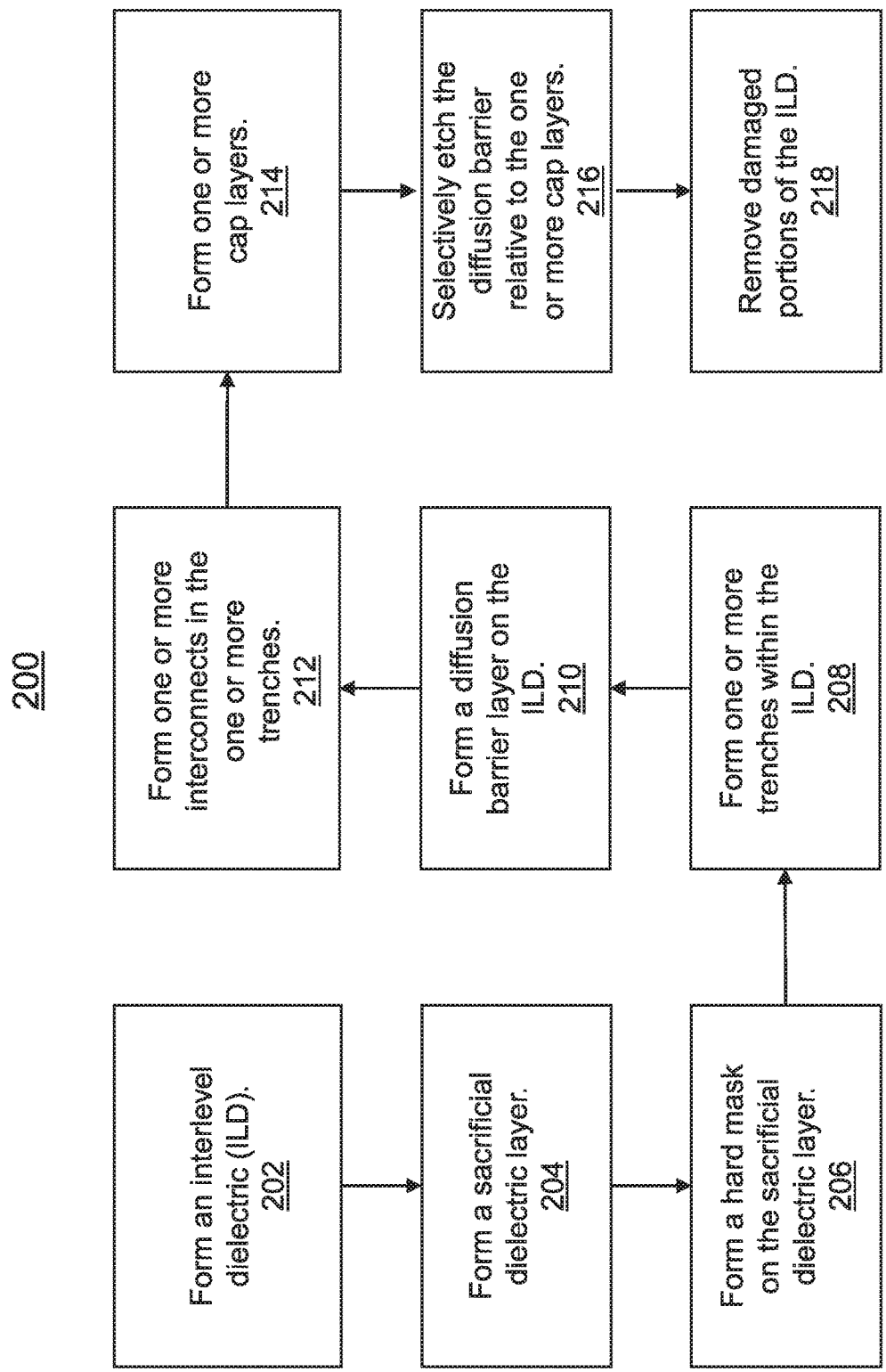
FIG. 7 is a block/flow diagram showing a system/method for back end of line (BEOL) integration for metal interconnects, in accordance with an embodiment of the present invention.

With reference to FIG. 7, a block/flow diagram is provided illustrating an exemplary system/method 200 for fabricating a semiconductor device.

At block 202, an interlevel dielectric (ILD) is formed. The ILD can have a dielectric constant (k) from, e.g., about 1 to about 5. In one embodiment, the ILD can include a low-k dielectric material. A low-k dielectric material is a dielectric material that includes a dielectric constant less than about 3.9, which corresponds to the dielectric constant of $SiO_2$. In one embodiment, the ILD can include an ultra low-k (ULK) dielectric material. For example, the ILD can include a dielectric material having a dielectric constant below, e.g., about 3.4. The ILD can be formed with a low-k dielectric material or an ULK dielectric material to reduce parasitic phenomena such as, e.g., resistance-capacitance delay, crosstalk and power dissipation.

The ILD can include any suitable dielectric material in accordance with the embodiments described herein. Examples of suitable dielectric materials include, but are not limited to, a carbon doped oxide dielectric material (e.g., SiCOH), a fluorinated silicon oxide material (e.g., SiOF), a spin-on methyl-silisesquioxane (MSQ), an organic polymer, etc.

At block 204, an optional sacrificial dielectric layer can be formed on the ILD using any suitable process in accordance with the embodiments described herein. The sacrificial dielectric layer can include any suitable dielectric material in accordance with the embodiments described herein. For example, the sacrificial dielectric layer can include, e.g., $SiO_2$ or a silicon nitride material (e.g., SiN or $Si_3N_4$).

At block 206, a hard mask is formed on the sacrificial dielectric layer using any suitable process in accordance with the embodiments described herein. The hard mask functions to maintain proper via and/or interconnect alignment during BEOL processing. The hard mask can include any material that has a suitable hardness for maintaining proper via and/or interconnect alignment during BEOL processing, in accordance with the embodiments described herein. In one embodiment, the hard mask can be a metal hard mask. For example, the hard mask can include, e.g., titanium nitride (TiN). The hard mask can enable patterning of one or more interconnects at, e.g., 10 nm and beyond.

At block 208, one or more trenches are formed within the ILD. Forming the one or more trenches within the ILD can include removing the sacrificial dielectric layer and hard mask. Any suitable processes can be used to form the one or more trenches. For example, forming the one or more trenches can include performing patterning through lithography and etching.

At block 210, a diffusion barrier layer is formed on the ILD. In one embodiment, as shown, the diffusion barrier layer can be conformally deposited along the exposed surfaces of the ILD, including along the walls of the one or more trenches. The diffusion barrier layer functions as a barrier to provide isolation to prevent the effects of diffusion of a conductive material from interconnects, while maintaining electrical conductivity. That is, the diffusion barrier layer should include material(s) that provide a suitably low diffusivity with respect to the conductive material, and a suitably high electrical conductivity. The diffusion barrier layer 140 can include any suitable material in accordance with the embodiments described herein. Examples of suitable materials for the diffusion barrier 140 can include metals such as, e.g., a tantalum (Ta), titanium (Ti), ruthenium (Ru), tungsten (W), nickel (Ni), hafnium (Hf), niobium (Nb), zirconium (Zr), cobalt (Co) and/or vanadium (V), and/or conductive ceramic materials such as, e.g., a tantalum nitride (e.g., TaN), a titanium nitride (e.g., TiN), a tungsten nitride (e.g., WN) and/or an indium oxide (e.g., $In_2O_3$).

At block 212, one or more interconnects are formed in respective ones of the one or more trenches. The one or more interconnects can be formed by depositing conductive material on the diffusion barrier layer in the one or more trenches. Forming the one or more interconnects can further include planarizing the conductive material (e.g., using CMP). The one or more interconnects can include any suitable conductive material in accordance with the embodiments described herein. Examples of suitable conductive materials for the one or more interconnects can include, but are not limited to, copper (Cu), cobalt (Co), ruthenium (Ru), aluminum (Al), etc.

At block 214, one or more cap layers are formed. The one or more cap layers are formed on respective ones of the one or more interconnects. The one or more cap layers can include any suitable material in accordance with the embodiments described herein. For example, the one or more cap layers can include, e.g., cobalt (Co). As described above with reference to FIG. 5, the one or more cap layers can function to increase reliability at least with respect to electromigration effects by protecting the surfaces of the one or more interconnects.

In one embodiment, forming the one or more cap layers on the interconnects includes selectively depositing the one or more cap layers on the one or more interconnects. In this embodiment, the one or more cap layers include a material that has properties permitting selective deposition on the one or more interconnects. For example, in an embodiment in which the one or more cap layers include Co, the diffusion barrier layer includes Ta(N) and the one or more interconnects include Cu, the selectivity of Co deposition between Ta(N) and Cu allows for the deposition on the Cu of the one or more interconnects, and not the Ta(N) of the diffusion barrier layer.

At block 216, the diffusion barrier is selectively etched relative to the one or more cap layers. The selective etching removes portions of the diffusion barrier layer along the ILD. That is, the one or more cap layers further function to protect the one or more interconnects during the selective etch process.

In one embodiment, the selective etch process includes a wet etch process. Wet etch processes use liquid etchants to remove materials. For example, one or more masks can be used to define patterns for material removal, such that materials that are not protected by the one or more masks are removed by the etchant(s). Wet etch processes can generally be viewed as including the following three steps: introduction of the etchant(s) (e.g., etchant diffusion); reaction between the etchant(s) and the corresponding material (e.g., a reduction-oxidation (redox) reaction); and removal of the byproducts of the reaction (e.g., byproduct diffusion). Wet etch processes are generally isotropic etch processes in which the etch process goes in all directions at substantially the same rate, in contrast to anisotropic etch processes that operate in fewer than all directions (e.g., one direction). However, wet etch processes can be anisotropic.

At block 218, damaged portions of the ILD can optionally be removed. For example, removing the damaged portions of the ILD can include recessing the ILD. As described above with reference to FIG. 6, the damaged portions of the ILD can be removed to increase reliability at least with respect to time-dependent dielectric breakdown (TDDB).

Further downstream processing can be performed on the device. For example, additional BEOL processing and post-fabrication processing (e.g., wafer testing, wafer dicing, wafer testing and packaging) can be performed.

Having described preferred embodiments of a semiconductor device and a method of BEOL integration for interconnects (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed:

1. A method for back end of line (BEOL) integration for one or more interconnects, comprising:
    forming one or more interconnects by depositing conductive material on a diffusion barrier layer in respective ones of one or more trenches formed within an interlevel dielectric;
    selectively depositing a cap layer material on the conductive material to form one or more cap layers on respective ones of the one or more interconnects; and
    selectively etching the diffusion barrier relative to the one or more cap layers to remove the portions of the diffusion barrier layer along the interlevel dielectric.

2. The method of claim 1, wherein forming the one or more interconnects further comprises planarizing the conductive material.

3. The method of claim 1, wherein forming the one or more interconnects includes forming the one or more interconnects to have an aspect ratio less than about 2.

4. The method of claim 1, wherein selectively etching the diffusion barrier relative to the one or more cap layers includes performing a wet etch process.

5. The method of claim 1, further comprising:
    forming the interlevel dielectric;
    forming a hard mask on the interlevel dielectric; and
    forming the one or more trenches within the interlevel dielectric.

6. The method of claim 5, further comprising forming a sacrificial dielectric layer prior to forming the hard mask.

7. The method of claim 5, wherein forming the interlevel dielectric includes forming the interlevel dielectric to include an ultra low-k dielectric material.

8. The method of claim 1, further comprising removing damaged portions of the interlevel dielectric.

9. A method for back end of line (BEOL) integration for one or more interconnects, comprising:
    forming an interlevel dielectric including a low-k dielectric material;
    forming one or more trenches within the interlevel dielectric;
    forming one or more interconnects by depositing conductive material on a diffusion barrier layer in respective ones of the one or more trenches;
    selectively depositing a cap layer material on the conductive material to form one or more cap layers on respective ones of the one or more interconnects; and
    selectively etching the diffusion barrier relative to the one or more cap layers to remove portions of the diffusion barrier layer along the interlevel dielectric.

10. The method of claim 9, wherein forming the one or more interconnects further comprises planarizing the conductive material.

11. The method of claim 9, wherein forming the one or more interconnects includes forming the one or more interconnects to have an aspect ratio less than about 2.

12. The method of claim 9, wherein selectively etching the diffusion barrier relative to the one or more cap layers includes performing a wet etch process.

13. The method of claim 9, wherein forming the interlevel dielectric includes forming the interlevel dielectric to include an ultra low-k dielectric material.

14. The method of claim 9, further comprising forming a hard mask on the interlevel dielectric.

15. The method of claim 14, further comprising foaming a sacrificial dielectric layer prior to forming the hard mask.

16. The method of claim 9, further comprising removing damaged portions of the interlevel dielectric.

* * * * *